April 11, 1961 L. W. ERATH 2,979,666

STABILIZED TRANSISTOR AMPLIFIER

Filed Oct. 14, 1958 2 Sheets-Sheet 1

INVENTOR

Louis W. Erath

BY

Burns, Doane, Benedict & Irons

ATTORNEYS

April 11, 1961 L. W. ERATH 2,979,666

STABILIZED TRANSISTOR AMPLIFIER

Filed Oct. 14, 1958 2 Sheets-Sheet 2

INVENTOR

Louis W. Erath

BY

Burns, Doane, Benedict & Irons

ATTORNEYS

United States Patent Office 2,979,666
Patented Apr. 11, 1961

2,979,666

STABILIZED TRANSISTOR AMPLIFIER

Louis W. Erath, Houston, Tex., assignor to Dresser Industries, Inc., Dallas, Tex., a corporation of Delaware Filed Oct. 14, 1958, Ser. No. 767,108
10 Claims. (Cl. 330—17)

This invention relates to amplifiers, and more particularly, to stabilized transistor amplifiers.

As is well known, junction transistors are inherently sensitive to temperature changes. The collector cutoff current of a junction transistor, that is, the collector current for zero emitter current, varies exponentially with temperature. As a result, maintaining the operating point of a junction transistor relatively constant during operation is a very difficult problem. The prior art has proposed many different solutions to this problem, including the use of so-called "stiff" voltage dividers connected to the base of the transistor. These prior art solutions have in general not been completely satisfactory. One of the most advantageous solutions to the stability problem is that proposed by Giacoletto in his Patent No. 2,816,964, issued December 17, 1957. That patent suggests the use of a stabilizer transistor connected between the emitter and base of the conventional amplifier circuit and operable to supply to the base of that amplifier a current varying with the difference between a standard voltage and the voltage across the emitter resistor of the amplifier. While this circuit is capable of achieving quite good temperature stability, the design overlooks changes in the collector to base current of the amplifying transistor, since the stabilization is based entirely on the emitter voltage of the transistor. Moreover, the circuit of Giacoletto is inherently of very low input impedance because of the presence of the auxiliary transistor connected directly across the input circuit.

The prime object of the present invention is to obtain very good stability for a transistor amplifier, yet without sacrificing input impedance. The objective is obtained by deriving the driving current for the auxiliary stabilization transistor from the output circuit of the amplifier, rather than from any other circuit, and by connecting the auxiliary transistor so that it does not directly shunt the input circuit of the amplifier.

The above and various other objectives of this invention will be more apparent from a consideration of the description of preferred embodiments of the invention, illustrated in the accompanying drawings.

Figure 1:
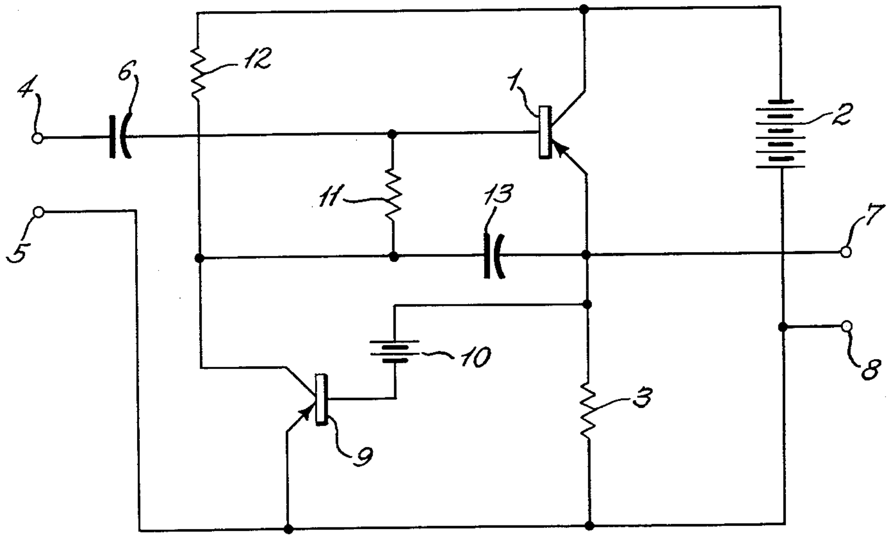
Fig. 1 is a schematic diagram of one embodiment of the invention.

Referring first to Fig. 1, the transistor amplifier includes a PNP junction transistor 1 having its collector connected to the negative sid of a voltage source 2 and its emitter connected through an output resistor 3 to the positive side of the source. The input or signal voltage is supplied to terminals 4 and 5, and terminal 4 is connected through blocking capacitor 6 to the base of transistor 1. Terminal 5 is connected to the positive side of the source 2. The output voltage from the amplifier is available across terminals 7 and 8 which are connected to opposite sides of resistor 3. It will be evident that the transistor 1 is connected as an emitter-follower amplifier and actually functions as a translator to change a high input impedance into a low output impedance.

The auxiliary stabilizer transistor 9 is also of the PNP junction type and has its base supplied with current corresponding with the output voltage by connection thereof through a bias battery 10 to the junction between the emitter of transistor 1 and resistor 3. The bias battery establishes a standard voltage which is compared with the output voltage across resistor 3. The emitter of transistor 9 is connected to the positive side of the main source 2. The collector of transistor 9 is connected through a resistor 11 to the base of transistor 1 and through bias resistor 12 to the negative side of source 2. Signal currents are bypassed around stabilizer transistor 9 through a capacitor 13 connected between the collector of the transistor and the base, and more specifically between the collector of transistor 9 and the emitter of transistor 1.

In operation of the apparatus of Fig. 1, the voltage of bias battery 10 is compared with the output voltage across resistor 3 and the difference between these two voltages determines the current through the collector resistor 12. Since a voltage determined by the magnitude of this current is supplied to the base of transistor 1, the base voltage is varied in opposite direction to the output voltage, so that D.-C. changes in output voltage are compensated for, and the transistor 1 is stabilized. In contrast, signal frequency voltages are bypassed around stabilizer transistor 9 so that there is no limiting action of the amplifier. Furthermore, the constants and parameters of the circuit are preferably selected so that no signal current flows in resistor 11, with the result that the input impedance of the amplifier 1 is very high. The transistor 1 otherwise functions in the usual emitter-follower fashion, to furnish a voltage of amplitude slightly less than its input voltage across resistor 3, this voltage being available at very low impedance.

Figure 2:
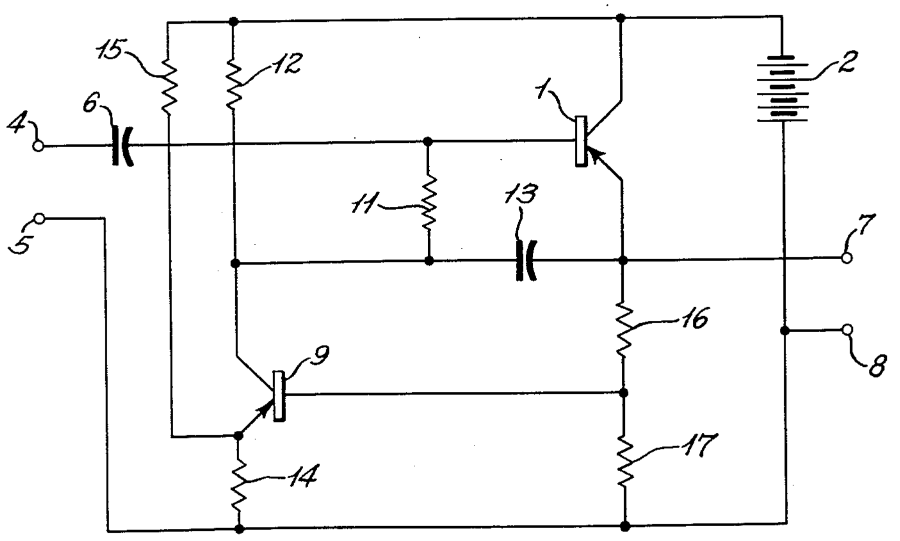
Fig. 2 is a schematic diagram of a modification of the apparatus of Fig. 1.

The apparatus of Fig. 2 is extremely similar to that of Fig. 1, but the standard voltage supplied in the apparatus of Fig. 1 by battery 10 is obtained in the apparatus of Fig. 2 from a voltage divider including resistors 14 and 15 connected across source 2. The junction between resistors 14 and 15 is connected to the emitter of stabilizer transistor 9. Also, the emitter of transistor 1 is connected to the positive side of the source through the series connection of resistors 16 and 17, rather than through a single resistor, and the base of stabilizer transistor 9 is connected to the junction between these two resistors. The output voltage is available across the series combination of resistors 16 and 17. The other elements of the apparatus of Fig. 2 are identical with those of Fig. 1 and are identified by the same reference numerals.

Figure 3:
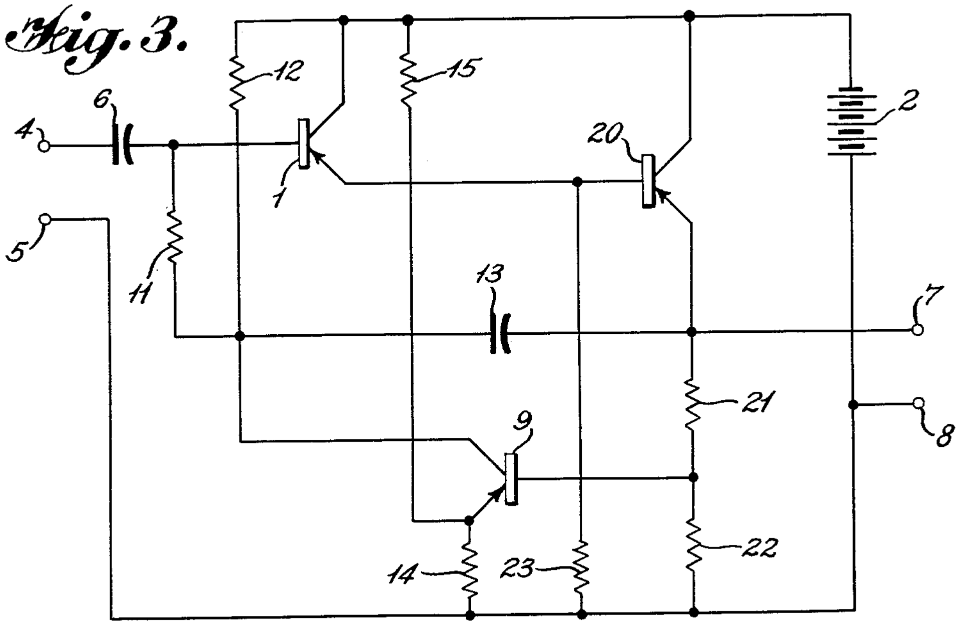
Fig. 3 is a schematic diagram of a modification of the apparatus of Fig. 2.

The apparatus of Fig. 3 is also very similar to that of Fig. 2, but it employs a second emitter-follower transistor 20 whose output is available across a pair of emitter resistors 21 and 22 connected between the emitter and the positive side of the source 2. The emitter of transistor 1 is connected to the same terminal through a resistor 23. In this circuit, the base current of the stabilizer transistor 9 is obtained from the voltage across resistor 22, the base being connected to the junction between the resistors 21 and 22. The bypass capacitor 13 is connected between the collector of transistor 9 and the emitter of transistor 20.

The apparatus of Fig. 3 is otherwise identical with that of Fig. 2 and the corresponding elements are identified with the same reference numerals. The apparatus of Fig. 3 permits use of a much higher base resistor 11 of the input transistor, since the base current can be much less. Therefore, the apparatus of Fig. 3 may readily be designed to have an input impedance of the order of 500,000 ohms, while the apparatus of Fig. 2 is limited to an input impedance of the order of 50,000 ohms.

Figure 4:
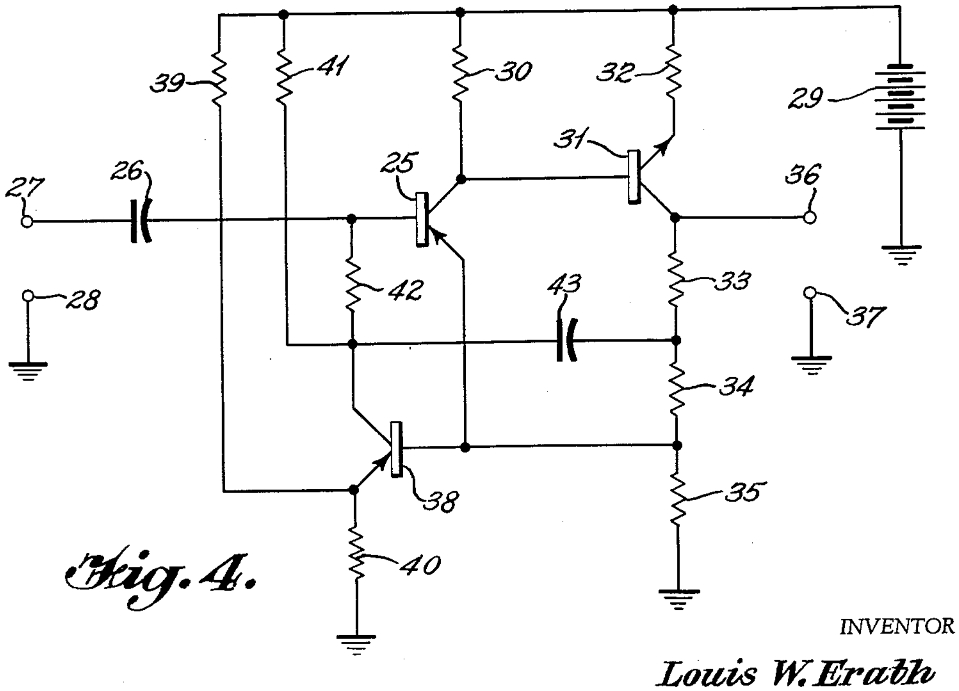
Fig. 4 is a schematic diagram of a high gain amplifier constructed in accordance with the principles of the invention.

Referring next to Fig. 4, the circuit therein described is a voltage amplifier circuit rather than an impedance translator, and includes a PNP junction transistor 25 having its base connected through coupling capacitor 26 to terminal 27 of the input. The other terminal 28 of the input is connected to ground, and the positive side of voltage source 29 is grounded. The collector of transistor 25 is connected through a resistor 30 to the negative side of the source, and to the base of a second amplifying transistor 31. Transistor 31 is of opposite conductivity type than transistor 25 and is shown as of the NPN type. The emitter of transistor 31 is connected to the negative side of the source through emitter resistor 32, while the collector is connected to ground through the series combination of resistors 33—35. The output voltage is available at terminals 36 and 37 across the series combination of resistors 33—35.

Stabilizer transistor 38, of the same type as transistor 25, has its base connected to the junction between resistors 34 and 35 and to the emitter of transistor 25. The standard voltage for stabilizer transistor 38 is established by a voltage divider including resistors 39 and 40 connected across the source 29 and with their junction connected to the emitter of transistor 38. The collector of transistor 38 is connected to the negative side of the source through resistor 41, and to the base of transistor 25 through resistor 42. Signal frequency currents are bypassed around stabilizer transistor 38 through a capacitor 43 connected between the collector of transistor 38 and the junction between resistors 33 and 34.

The apparatus of Fig. 4 functions in similar manner to those of Figs. 1 through 3. However, a high gain is available through the two common-emitter transistors 25 and 31. In all of the circuits illustrated, the output voltage is compared with a reference voltage selected either by a bias battery or a voltage divider, and the differences between these voltages control the output current of a stabilizer transistor which supplies current to the base of an input transistor. In all cases also, signal frequencies are bypassed around the stabilizer transistor and the stabilizer transistor is not connected directly across the input, so that the degenerative effect of the feedback through the capacitor furnishes the circuit with a very high input impedance.

The various circuits shown in Figs. 1–4 also stabilize the transistors against changes in base to collector current caused by changes in current. For instance, referring to Fig. 1, assuming that the temperature increases, the base-collector current of transistor 1 will tend to increase, thereby tending to decrease the base-collector voltage thereof and, since the collector is at a fixed bias, to drive the base in the negative direction. Since the collector of transistor 9 is connected to the base of transistor 1, that collector also tends to go negative. But, since the base of transistor 9 is at a relatively fixed potential, the base-collector current tends to increase, thereby tending to decrease the base-collector voltage of the transistor. The collector of transistor 9 therefore tends to go positive and oppose the tendency of the base of transistor 1 to go negative. Changes in base-collector current of transistor 1 by temperature changes are therefore opposed and the transistor further temperature-stabilized.

Transistor 1 of Figs. 2 and 3 and transistor 25 of Fig. 4 are similarly stabilized against base-collector current changes.

It will be evident that many minor changes and additions could be made to the apparatus described as preferred embodiments of the invention. One specific change that could be readily made is the use of opposite polarity transistors to the types of those illustrated. Therefore, the invention is not to be considered limited to the specific embodiments disclosed, but rather only by the scope of the appended claims.

I claim:

1. A stabilized amplifier including a first transistor having an input circuit for conducting signal current to its base, an output circuit including a load connected in series with its emitter and collector, a voltage source connected to said first transistor to supply operating voltages thereto, a second transistor having its emitter connected to the collector side of said load and its base connected to the emitter side of said load to receive current of amplitude varying with the output voltage, the collector of said second transistor being resistively connected to the base of said first transistor to furnish stabilizing current for said base, a capacitor for shunting signal currents around said second transistor connected between the base and collector thereof, said second transistor being of the same conductivity type as said first transistor, and a bias circuit for the emitter of said second transistor.

2. A high impedance input circuit stabilized amplifier including a first transistor having an input circuit for conducting signal current to its base, an output circuit including a load connected in series with its emitter and collector, a voltage source connected to said first transistor to supply operating voltages thereto, a second transistor having its emitter connected to the collector side of said load and its base connected to the emitter side of said load to receive current of amplitude varying with the output voltage, a base resistor having one of its ends connected to the base of said first transistor and to one side of said input circuit, the other end of said resistor being connected in series with the emitter-collector circuit of said second transistor to the other side of said input circuit, said second transistor being of the same conductivity type as said first transistor, a bias circuit for said second transistor, and a capacitor for shunting signal currents around said second transistor connected between said other end of said resistor and the base of said second transistor.

3. A stabilized amplifier including a first transistor connected in emitter-follower fashion, an input circuit for conducting signal current to the base of said first transistor, a source of voltage, means including a first resistor connected between the emitter of said first transistor and one side of said source, the collector of said first transistor being connected to the other side of said source, the output voltage from said amplifier being available across said first resistor, a second transistor having its base connected to the emitter of said first transistor so as to receive base current varying with the output voltage of said amplifier, means connecting the emitter of said second transistor to said one side of said source, a second resistor connected between the collector of said second transistor and the base of said first transistor, and a capacitor connected between base and collector of said second transistor to bypass signal currents around the second transistor.

4. The apparatus of claim 3 including a third resistor connected between said other side of the source and the collector of said second transistor.

5. The apparatus of claim 4 including a bias source connected between the base of said second transistor and the emitter of said first transistor.

6. A stabilized amplifier including a first transistor having an input circuit for conducting signal current to its base, a voltage source having one of its sides connected to the collector of said first transistor, a pair of resistors connected in series between the emitter of said first transistor and the other side of said source, the output voltage of said amplifier being available across said pair of resistors, a second transistor having its base connected to the junction between said pair of resistors, a resistive voltage divided connected across said source, the junction between the resistors of said voltage divider being connected to the emitter of said second transistor, the collector of said second transistor being resistively connected to the base of said first transistor, and a capacitor for bypassing signal current connected between the emitter of said first transistor and the collector of said second transistor.

7. The apparatus of claim 6 including a fifth and a sixth resistor connected in series between the base of said first transistor and the collector thereof, the collector of said second transistor being connected to the junction between said fifth and sixth resistors.

8. A stabilized amplifier including a first transistor having an input circuit for conducting signal current to its base, a voltage source having one of its terminals connected to the collector of said first transistor, a second transistor having its base connected to the emitter of said first transistor, a first resistor connected between the emitter of said first transistor and the other terminal of said source, second and third resistors connected between the emitter of said second transistor and said other side of the source, the output voltage of said amplifier being available across said second and third resistors, the collector of said second transistor being connected to said one side of the source, a third transistor having its base connected to the junction between said second and third resistors, a signal frequency bypass capacitor connected between the emitter of said second transistor and the collector of said third transistor to bypass signal currents around said third transistor, fourth and fifth resistors connected in series between said one terminal of the source and the base of said first transistor, the collector of said third transistor being connected to the junction between said fourth and fifth resistors, and a resistive voltage divider connected across the source and having the junction between its resistors connected to the emitter of said third transistor.

9. A stabilized amplifier including a first transistor having an input circuit for conducting signal current to its base, a second transistor of opposite conductivity type to said first transistor having its base connected to the collector of the first transistor, a voltage source, a first resistor connected between the collector of said first transistor and one terminal of said source, second and third resistor connected in series between the collector of said second transistor and the other terminal of said source, the output voltage of said amplifier being available across said second and third resistors, means connecting the emitter of said second transistor to said one side of the source, a third transistor of the same type as said first transistor having its base connected with the emitter of said first transistor to the junction between said second and third resistors, a signal frequency bypass capacitor connected between the collectors of said second and third transistors for bypassing signal current around said third transistor, a bias circuit for the emitter of said third transistor, and means resistively connecting the collector of said third transistor to the base of said first transistor.

10. A stabilized amplifier including first, second and third transistors, said first and third transistors being of the same type and said second transistor being of opposite conductivity type, an input circuit for connecting signal current to the base of said first transistor, a voltage source, a first resistor having one of its ends connected to one side of said source and its other end connected to the collector of said first transistor and the base of said second transistor, means connecting the emitter of said second transistor to said one side of the source, second, third and fourth resistors connected in series between the collector of said second transistor and the other side of said source, the output voltage of said amplifier being available across said second, third and fourth resistors, the base of said third transistor being connected to the emitter of said first transistor and to the junction between said third and fourth resistors, a signal frequency bypass capacitor connected between the collector of said third transistor and the junction between said second and third resistors to bypass signal frequencies around said third transistor, a fifth and a sixth resistor connected in series between the base of said first transistor and said one side of the source, the collector of said third transistor being connected to the junction between said fifth and sixth resistors, and seventh and eighth resistors connected across the source, the emitter of said third transistor being connected to the junction between said seventh and eighth resistors.

References Cited in the file of this patent

UNITED STATES PATENTS

| | | |
|---|---|---|
| 2,761,917 | Aronson | Sept. 4, 1956 |
| 2,789,164 | Stanley | Apr. 16, 1957 |
| 2,801,296 | Blecher | July 30, 1957 |
| 2,816,964 | Giacoletto | Dec. 17, 1957 |